(12) United States Patent
Kageyama (10) Patent No.: US 7,816,260 B2
(45) Date of Patent: Oct. 19, 2010

(54) METHOD FOR FABRICATING SEMICONDUCTOR DEVICE

(75) Inventor: Makiko Kageyama, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 86 days.

(21) Appl. No.: 11/822,213

(22) Filed: Jul. 3, 2007

(65) Prior Publication Data

US 2008/0050914 A1 Feb. 28, 2008

(30) Foreign Application Priority Data

Aug. 25, 2006 (JP) ............................. 2006-229627

(51) Int. Cl.
*H01L 21/44* (2006.01)
(52) U.S. Cl. .................. 438/660; 438/636; 438/688; 257/E21.627
(58) Field of Classification Search .......... 438/660, 438/636, 688; 257/E21.627
See application file for complete search history.

(56) References Cited

U.S. PATENT DOCUMENTS 5,665,659 A * 9/1997 Lee et al. ............... 438/646
6,946,387 B2 * 9/2005 Wada et al. ............. 438/629
2003/0022491 A1 * 1/2003 Bae et al. ............... 438/660
2003/0181032 A1 * 9/2003 Kawano ................. 438/633
2004/0241980 A1 * 12/2004 Yamazaki et al. ........ 438/632
2005/0095845 A1 * 5/2005 Kawano ................. 438/633
2005/0179068 A1 * 8/2005 Rueb et al. .............. 257/288
2008/0073793 A1 * 3/2008 Urabe et al. ............. 257/765

FOREIGN PATENT DOCUMENTS

| JP | 59-34646 | 2/1984 |
| JP | 62-165328 | 7/1987 |
| JP | 6-53216 | 2/1994 |
| JP | 2003-243570 | 8/2003 |

* cited by examiner

*Primary Examiner*—George Fourson
*Assistant Examiner*—John M Parker
(74) *Attorney, Agent, or Firm*—Rabin & Berdo, PC (57) ABSTRACT

A method for fabricating a semiconductor device according to the present invention includes: a step for forming a wiring layer on a semiconductor substrate; a step for patterning the wiring layer; and a step for covering the wiring layer with a protective insulating film. Moreover, after the step for forming the wiring layer, all required heat treatment steps to be performed prior to the step for covering the wiring layer with the protective insulating film are performed at a temperature lower than a temperature for plastic deformation of the wiring layer.

4 Claims, 9 Drawing Sheets

METHOD FOR FABRICATING SEMICONDUCTOR DEVICE

CROSS REFERENCE TO RELATED APPLICATION

This application claims the priority of Application No. 2006-229627, filed Aug. 25, 2006 in Japan, the subject matter of which is incorporated herein by reference.

TECHNICAL FIELD OF THE INVENTION

The present invention relates to a method for fabricating a semiconductor device, in particular, a method of forming wiring.

BACKGROUND OF THE INVENTION

Figure 9A:
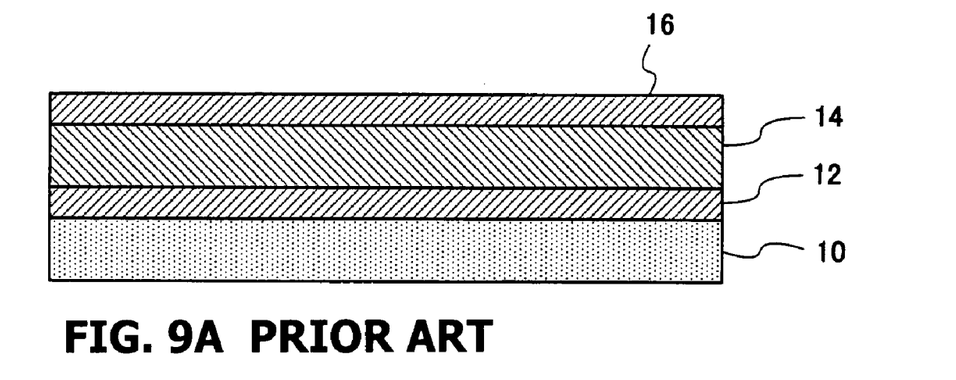
FIGS. 9A to 9C are cross-sections showing steps of the main parts in a conventional method for fabricating a semiconductor device.
Figure 9B:
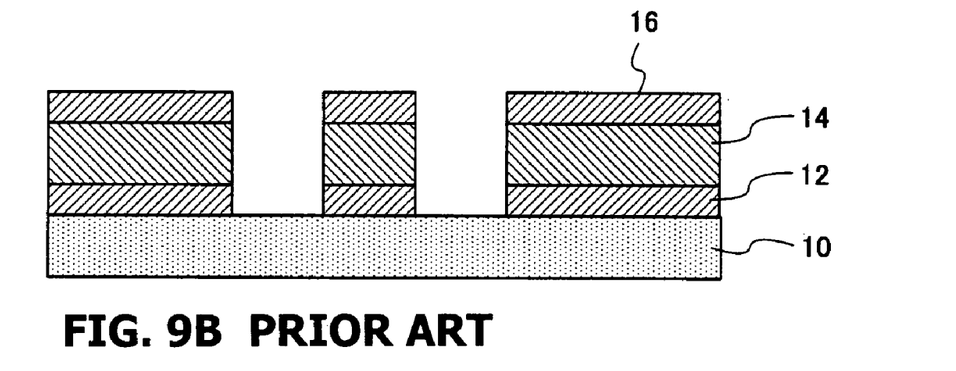

Generally, the top wiring layer of a multilayer wiring using an aluminum alloy in semiconductor devices has a structure as shown in FIG. 9B. In a conventional method shown in FIG. 9, on an insulating film 10 is formed a high melting metal layer 12 having TiN, Ti, or the like as a main component of about 30 to 100 nm, and an aluminum alloy layer 14 of a desired thickness is formed thereon by sputtering, as shown in FIG. 9A. Then, on the aluminum alloy layer 14 is formed an anti-reflection film 16 having TiN as a main component.

Figure 9C:
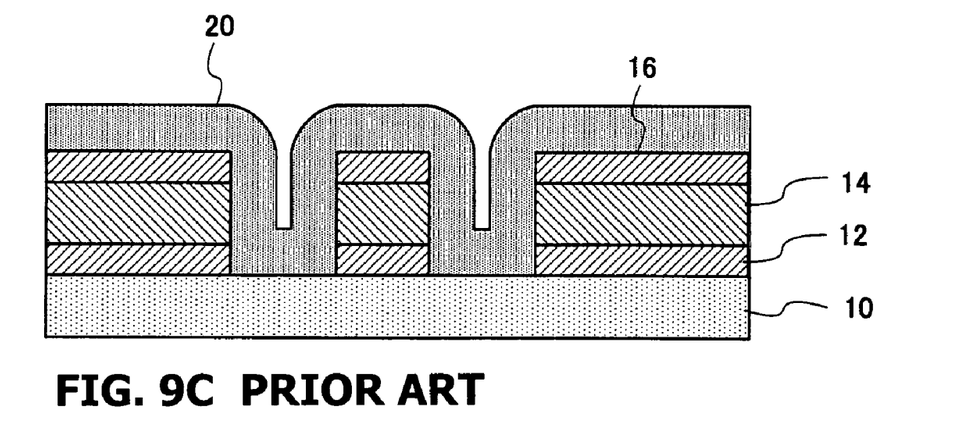

Next, after transferring a pattern by a photolithography technique, patterning is performed on the layered structure formed as shown in FIG. 9A by dry etching using a Cl based gas as shown in FIG. 9B. In this condition, a resist (not shown) is removed by $O_2$ ashing at about 300° C. Next, annealing is performed at about 350° C. to 400° C. in a gas containing $H_2$. Then, as shown in FIG. 9C, a SiN film 20 is formed as a passivation film by a CVD technique.

Japanese Unexamined Patent Publication No. 2003-243570 discloses an invention related to an inductor using a thick aluminum wiring.

Normally, the thickness of an aluminum alloy film used for wiring is 1 μm or less. However, recently, in some cases in high frequency devices, aluminum alloy films having a thickness of about 2.5 to 5.0 μm are used. Conventionally, since the design rules are not strict, in many cases, wet etching using an acid or the like is performed on wirings having such a thickness.

However, recently, due to reasons of design rules, the number of cases are being increased in which aluminum wirings having such a thickness have to be worked by dry etching. In such cases, problems may occur in which, after performing heat treatment such as ashing or sintering after etching the wiring, a stress in the aluminum itself causes troubles such as fluctuation of characteristics of the base transistor and cracking of the interlayer insulating film just below the aluminum layer. When a heat history is applied to the aluminum alloy (wiring layer) in a step after formation, since the coefficient of thermal expansion is different, a compressive stress is applied to the aluminum when the temperature rises, causing plastic deformation. The stress is relieved at the same time as when the aluminum is plastically deformed, and the crystals of aluminum are more stabilized due to grain growth and elimination of defects. Cooling thereafter provides a large tensile stress.

In normal wirings (thin wirings), there are only a few cases where the stress itself becomes problematic. However, if the aluminum alloy becomes 5 to 10 times thicker than a normal wiring, the total stress is increased for that amount, and the effect on the base is also increased. Generally, the stress can be relieved by making slits in the aluminum wiring itself. However, in terms of the performance of high frequency elements, introduction of slits is difficult in many cases. Moreover, in thick aluminum wirings, the slit release property by etching is not satisfactory, and the slit should be wider than 1 μm, thus making slits itself difficult.

Figure 4:
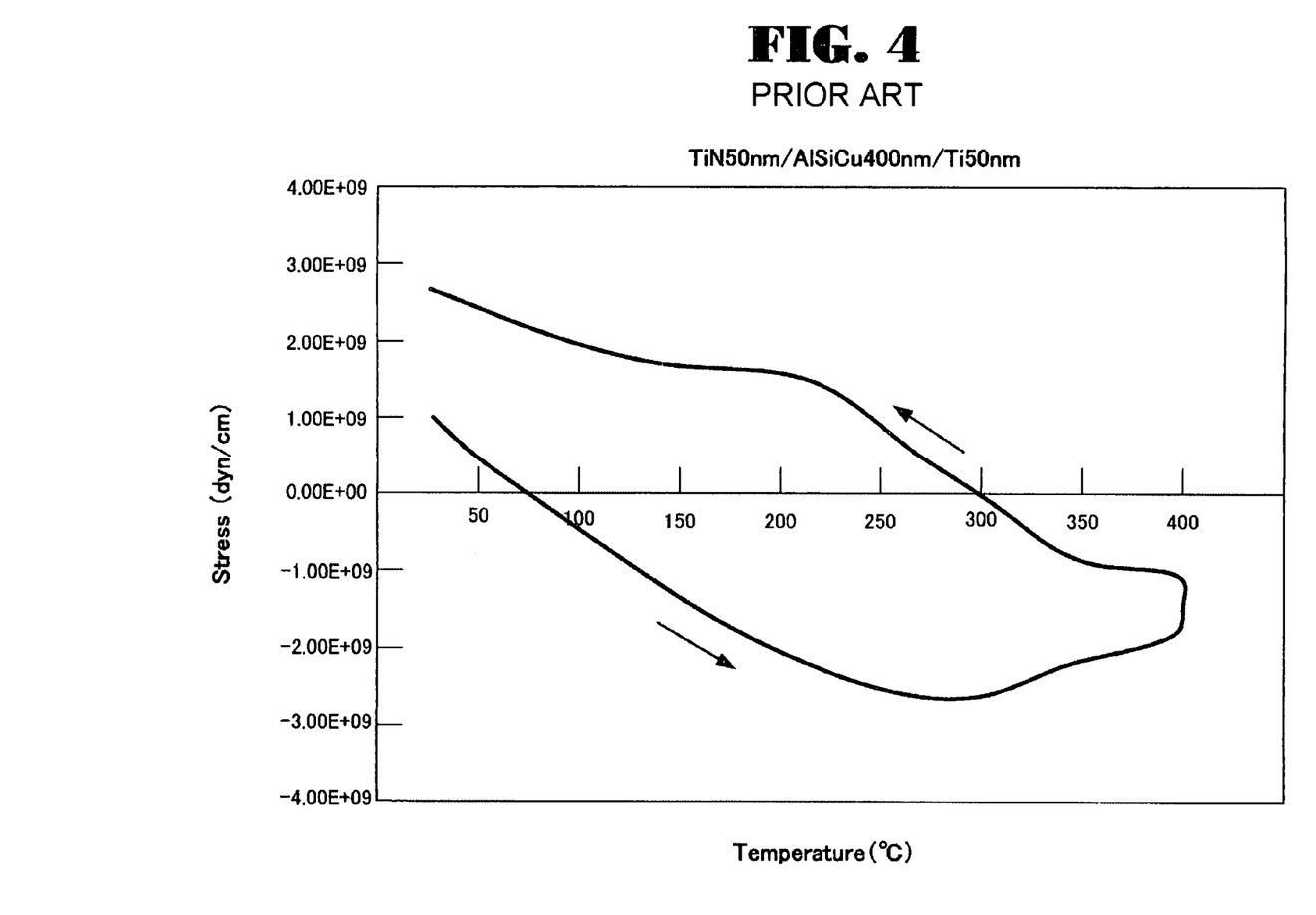
FIG. 4 is a graph showing the relation between temperature and internal stress of a typical aluminum wiring.

FIG. 4 shows a thermal stress curve of an aluminum layered film having a thickness of 400 nm which is typically used for wirings. Since aluminum has a greater coefficient of thermal expansion than that of a semiconductor substrate, a compressive stress occurs in the aluminum film as it is heated. Moreover, plastic deformation occurs, for example, during a recrystallization process, at about 250 to 300° C. Then, the stress is relieved as the aluminum recovers from defects, the grains grow, and hillocks partially occur.

Figure 5:
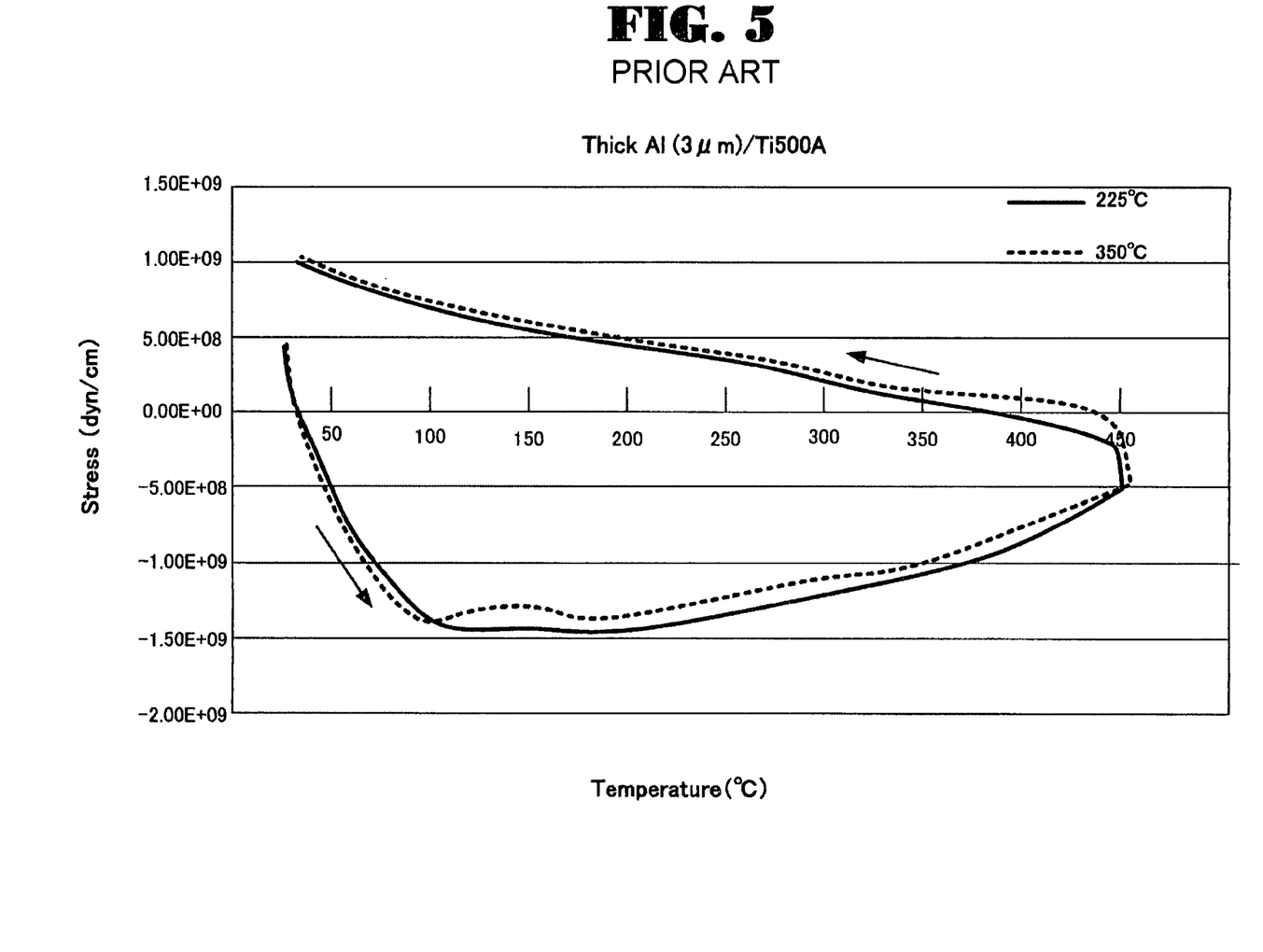
FIG. 5 is a graph showing the relation between temperature and internal stress of an aluminum wiring applicable to the present invention.

FIG. 5 shows a thermal stress curve of an aluminum layered film having a thickness of 3000 nm. It is shown that, in a thick aluminum layer, plastic deformation starts at a low temperature of about 100 to 150° C. Since the stress is generally shown by a value normalized by the film thickness, the value of the stress looks small in the graph. However, as the film gets thicker, the total stress is increased for that amount. If the thickness of the aluminum film is 4000 nm (4 μm), the total stress becomes 10 times. A thick film has a large stress of its own, and thus yields at a lower temperature. Moreover, in a thick aluminum film, since grains grow largely in the process of film formation, the film is prone to have less defects therein and thus be readily plastically deformed. This is considered to be the reason why the film readily yields at an even lower temperature.

OBJECTS OF THE INVENTION

An object of the present invention is to provide a method capable of avoiding problems due to thermal stress of a wiring layer including aluminum, an aluminum alloy, or the like.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A method for fabricating a semiconductor device according to the present invention includes: a step for forming a wiring layer on a semiconductor substrate; a step for patterning the wiring layer; and a step for covering the wiring layer with a protective insulating film. Moreover, all required heat treatment steps to be performed prior to the step for covering the wiring layer with the protective insulating film are performed at a temperature lower than a temperature for plastic deformation of the wiring layer.

Here, the temperature for plastic deformation is preferably set with consideration of the conductive materials themselves constituting the wiring layer and the film thickness. This is intended to reliably prevent plastic deformation of the wiring layer in steps before the wiring layer is covered with the protective insulating film. For example, if the wiring layer includes an aluminum or aluminum alloy layer, all the heat treatment steps can be performed at a temperature lower than 150° C.

Moreover, the wiring layer which is not yet covered with the protective insulating film yet can be heated by a heat treatment so as to intentionally induce plastic deformation. For example, if the wiring layer includes an aluminum or aluminum alloy layer, the wiring layer is heated to about 350° C. to 400° C. so as to induce plastic deformation, making a stable state in terms of thermal deformation. Furthermore, after the wiring layer is plastically deformed, the wiring layer is preferably covered with the protective insulating layer while keeping the temperature of the wiring layer higher than the temperature for plastic deformation.

As described above, after working of the wiring layer, in all steps until the protective insulating layer (passivation film) is formed to cover the wiring, the temperature is kept lower than the temperature for plastic deformation of the wiring layer (such as aluminum and aluminum alloy), and thus plastic deformation can be prevented during the time until the protective insulating film is formed. Accordingly, generation of a large tensile stress can be suppressed in the cooling process after plastic deformation. Moreover, due to high adhesion between the protective insulating film and the wiring layer, in the following history (consequence) of heat-treatments (such as formation of a SiN film at a temperature higher than 350° C.) or the like, plastic deformation of the wiring pattern can be prevented. As a result, cracking of the wiring pattern due to stress, and fluctuation of transistor characteristics due to stress, can be prevented or alleviated.

BRIEF DESCRIPTION OF THE REFERENCE SYMBOLS

100. Interlayer Insulating Film
102. High Melting Metal Layer
104. Aluminum alloy layer (wiring layer)
106. High Melting Metal Layer
107. Resist
108. Protective insulating layer (passivation film)
110. SiN film
200. Interlayer Insulating Film
202. High Melting Metal Layer
204. Aluminum alloy layer (wiring-layer)
206. High Melting Metal Layer
207. Resist
208. $SiO_2$ layer
210. SiN film

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
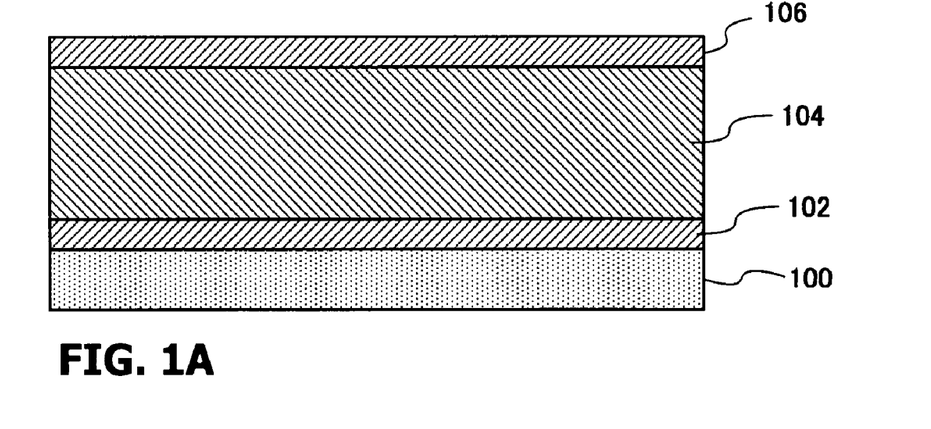
FIGS. 1A to 1C are cross-sections showing steps of the main parts in a method for fabricating a semiconductor device according a first embodiment of the present invention.

FIG. 1A to FIG. 2B are cross-sections showing steps of a first embodiment of the present invention. In the present embodiment, steps of the top wiring layer of the multilayer wiring structure are described according to the flowchart of FIG. 3. Firstly, a high melting metal layer 102 having TiN, Ti, or the like as a main component is formed in about 100 nm on an interlayer insulating film 100, and an aluminum alloy layer (wiring layer) 104 is formed in 3000 nm thereon. Next, as shown in FIG. 1A, a high melting metal layer 106 having a Ti/TiN layered structure is formed on the aluminum alloy layer 104.

Figure 1B:
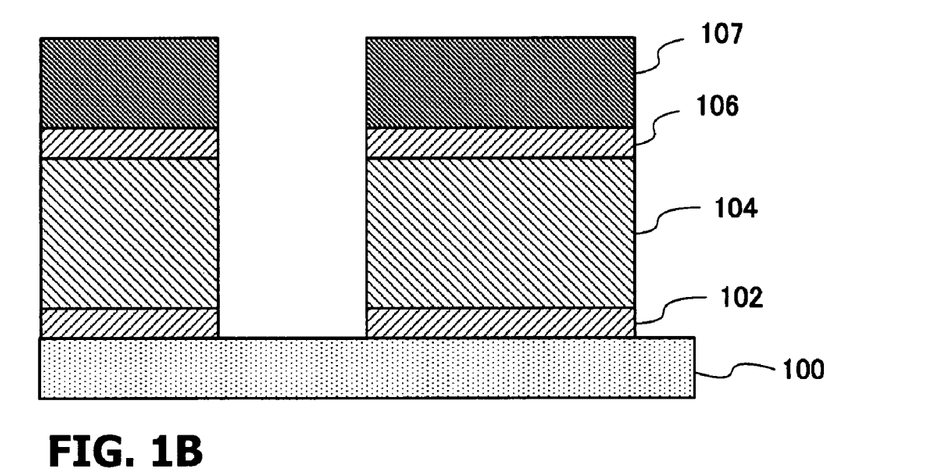

Next, as shown in FIG. 1B, a resist 107 is coated on the high melting metal layer 106 to perform patterning by a photolithography process. Then, etching is performed at a temperature lower than 100° C., to perform patterning of the wiring layers (102, 104, and 106). It is important to perform the etching step at a temperature lower than the temperature for plastic deformation of the aluminum alloy (for example, 150° C.).

Figure 1C:
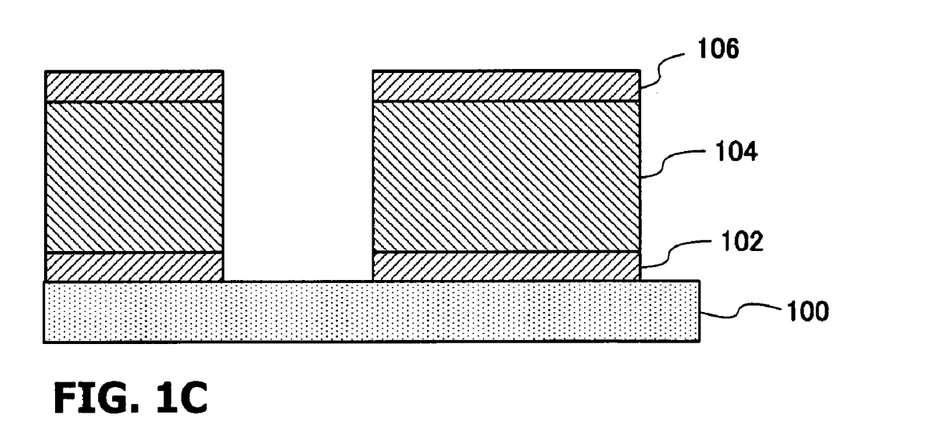

Next, as shown in FIG. 1C, the resist 107 is removed by plasma-ashing at a temperature lower than 100° C., or with sulfuric acid or the like at a temperature lower than 100° C.

Figure 2A:
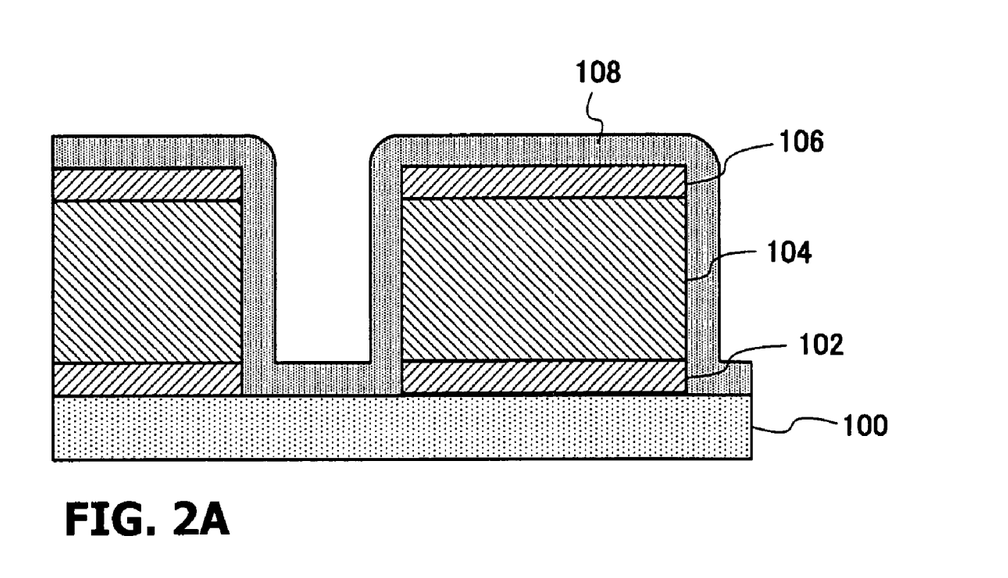
FIGS. 2A and 2B are cross-sections showing steps of the main parts in the method for fabricating a semiconductor device according the first embodiment of the present invention, which are continued from FIG. 1C.
Figure 2B:
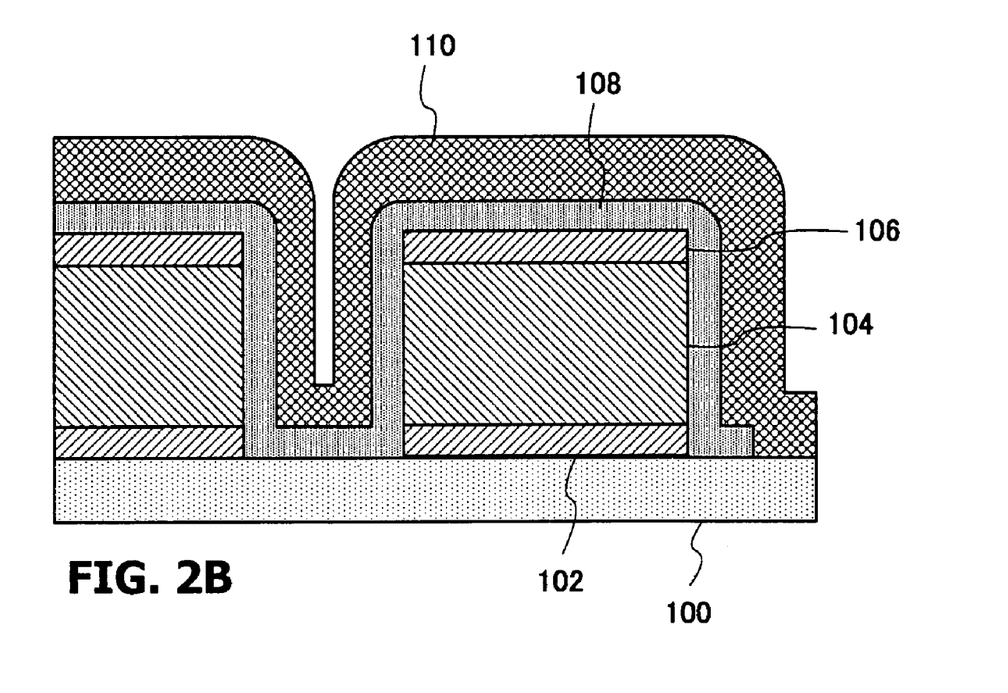
Figure 3:
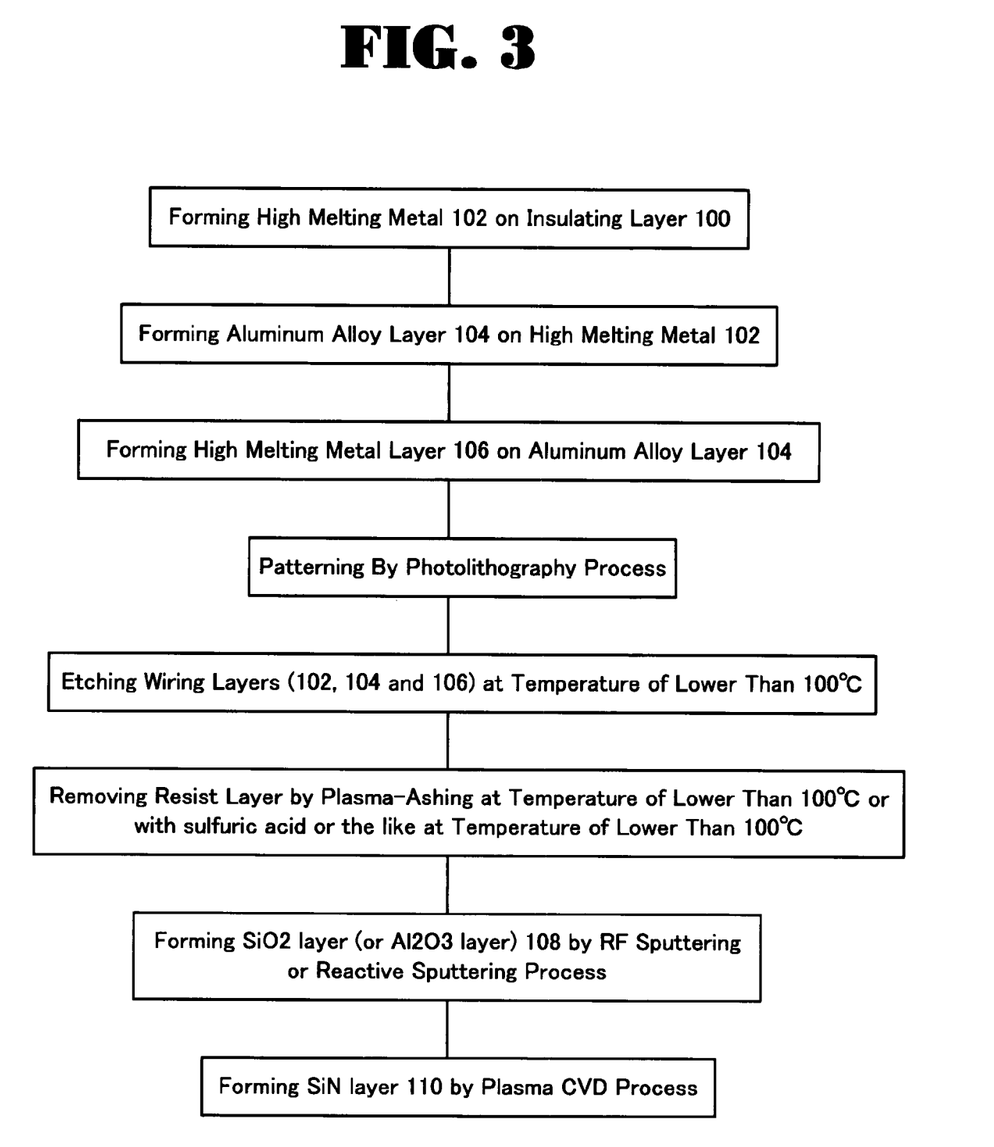
FIG. 3 is a flowchart showing steps of the main parts in the method for fabricating a semiconductor device according the first embodiment of the present invention.

Next, as shown in FIG. 2A, a $SiO_2$ film (or $Al_2O_3$ film) 108 is formed in a thickness of about 300 to 800 nm by an RF sputtering process or reactive sputtering process. Then, as shown in FIG. 2E, a SiN film 110 is formed in a thickness of 1200 nm on the $SiO_2$ film 108 by a plasma CVD process.

In the embodiment, after working of the wiring layers including the aluminum alloy layer 104, in all steps until the protective insulating layer (passivation film) 108 is formed to cover the wiring, the temperature is kept lower than the temperature for plastic deformation of the wiring layers (such as aluminum and aluminum alloy), and thus plastic deformation can be prevented during the time until the protective insulating film 108 is formed. Accordingly, generation of a large tensile stress can be suppressed in the cooling process after plastic deformation. Moreover, due to high adhesion between the protective insulating film 108 and the wiring layers (102, 104, and 106), in the following heat history (such as formation of a SiN film 110 at a temperature higher than 350° C.) or the like, plastic deformation of the wiring pattern can be prevented. As a result, cracking of the wiring pattern due to stress, and fluctuation of transistor characteristics due to stress can be prevented or alleviated.

Figure 6A:
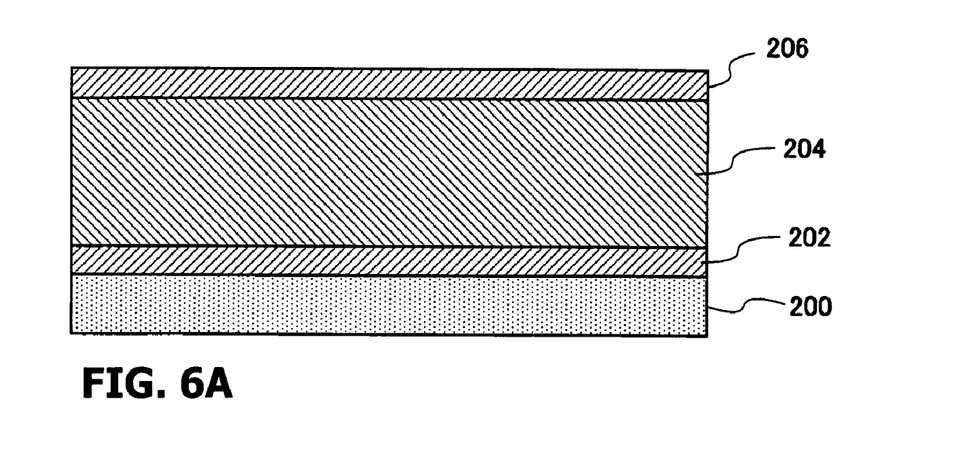
FIGS. 6A to 6C are cross-sections showing steps of the main parts in a method for fabricating a semiconductor device according a second embodiment of the present invention.

FIG. 6A to FIG. 7B are cross-sections showing steps of a second embodiment of the present invention. In the present embodiment, steps of the top wiring layer of the multilayer wiring structure are described according to the flowchart of FIG. 8. Firstly, a high melting metal layer 202 having TiN, Ti, or the like as a main component is formed in about 100 nm on an interlayer insulating film 200, and an aluminum alloy layer (wiring layer) 204 is formed in 3000 nm thereon. Next, as shown in FIG. 6A, a high melting metal layer 206 having a Ti/TiN layered structure is formed on the aluminum alloy layer 204.

Figure 6B:
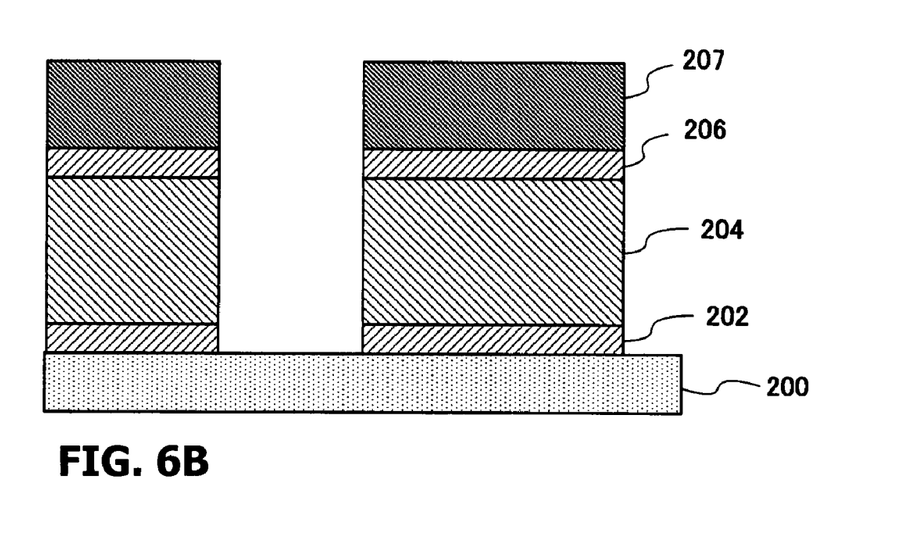

Next, as shown in FIG. 6B, a resist 207 is coated on the high melting metal layer 206 to perform patterning by a photolithography process. Then, etching is performed at a temperature lower than 100° C., to perform patterning of the wiring layers (202, 204, and 206). It is important to perform the etching step at a temperature lower than the temperature for plastic deformation of the aluminum alloy (for example, 150° C.).

Figure 6C:
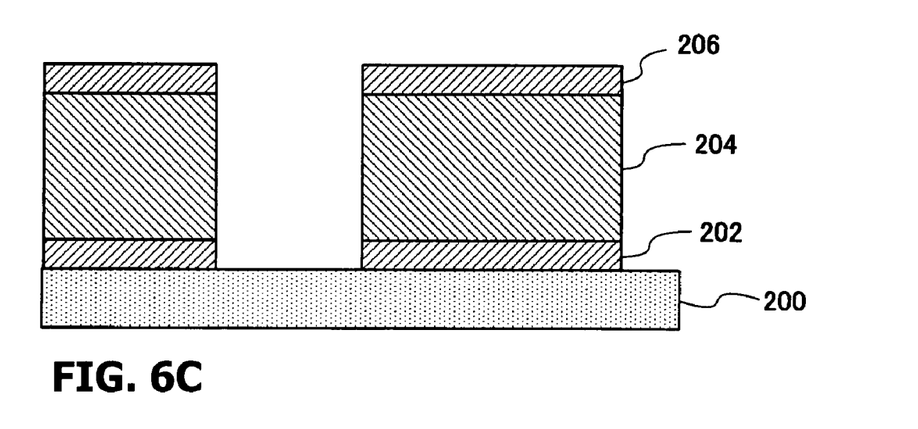

Next, as shown in FIG. 6C, the resist 207 is removed by plasma-ashing at a temperature lower than 100° C., or with sulfuric acid or the like at a temperature lower than 100° C.

After the resist 207 is removed, a wafer is placed on a heated susceptor and left for at least 10 minutes until plastic deformation of the aluminum alloy is almost completed in a stable state. Next, at the same temperature, a SiO$_2$ film 208 is formed in a thickness of 500 nm by a CVD process (refer to FIG. 7A).

Subsequently, a SiN film 210 is formed in a thickness of 1200 nm by a CVD process while keeping the temperature higher than 150° C. (refer to FIG. 7B).

Since the thermal stress curve shown in FIG. 5 is measured in

Since the thermal stress curve shown in FIG. 5 is measured in a state where the metal film is formed all over the wafer, plastic deformation during cooling of the wafer is performed in a manner such that defects are taken into the film. However, in the case of the patterned wiring, the tensile stress during cooling can be alleviated by deformation of the wiring itself, and plastic deformation occurs more readily than the case where the film is formed all over the wafer. In such a case, cracking and deterioration of the characteristics are considered to become remarkable just below the end of the wiring where stress is focused during cooling.

Figure 7A:
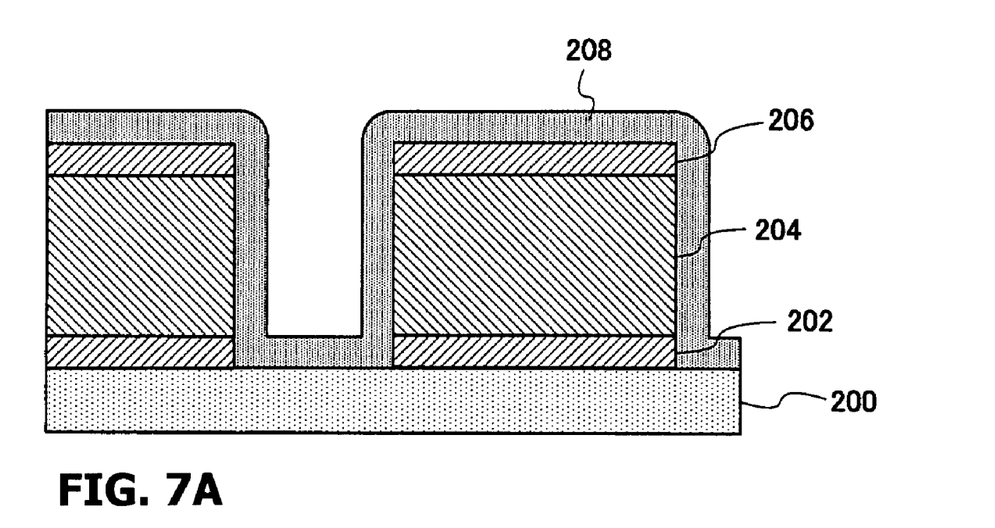
FIGS. 7A and 7B are cross-sections showing steps of the main parts in the method for fabricating a semiconductor device according the second embodiment of the present invention, which are continued from FIG. 6C.
Figure 7B:
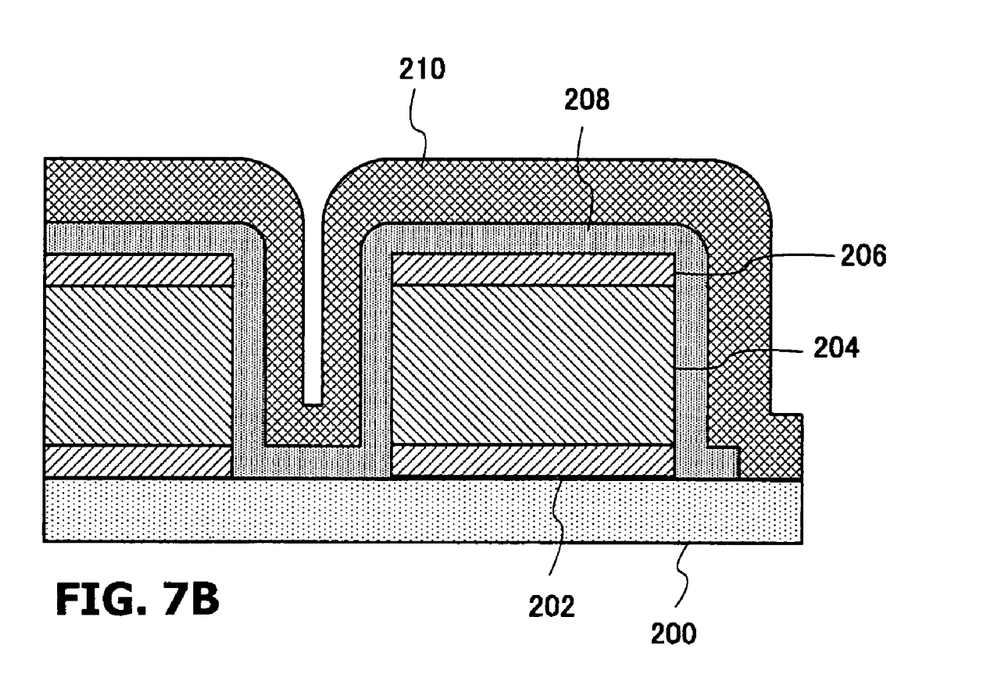
Figure 8:
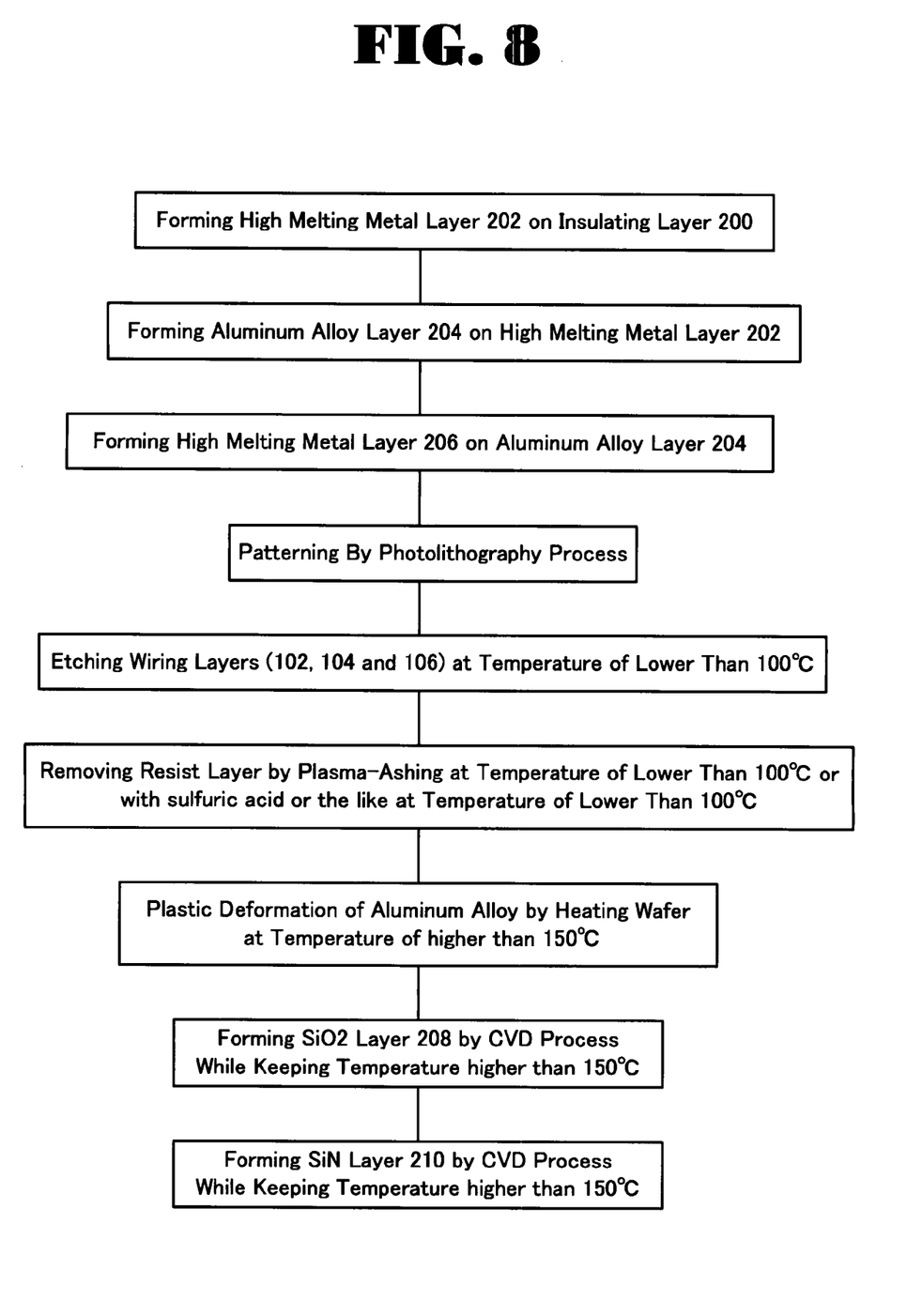
FIG. 8 is a flowchart showing steps of the main parts of the method for fabricating a semiconductor device according the second embodiment of the present invention.

Therefore, similarly to the first embodiment mentioned above, after working of the wiring, all steps until the protective insulating layer (208) is formed, are performed at a temperature lower than the temperature for plastic deformation (150° C.). Together with this, subsequently the wiring is intentionally heated so as to induce sufficient plastic deformation, and is covered with the protective insulating film (208) at the same temperature. By so doing, the aluminum can be prevented from being contracted during cooling after the protective insulating film (208) is fabricated. Accordingly, generation of a large tensile stress can be suppressed in the cooling process after plastic deformation. As a result, cracking due to stress, and fluctuation of transistor characteristics due to stress can be prevented.

Moreover, in the first embodiment, the protective insulating film (108) is formed by a sputtering process, whereas in the present embodiment, the film is formed by a general CVD process, facilitating the fabrication. Furthermore, metal annealing is substantially performed, and thus an effect of improving the reliability of the wiring can be expected.

What is claimed is:

1. A method for fabricating a semiconductor device comprising:
    forming a wiring layer on a semiconductor substrate, the wiring layer being a multilayer structure including an aluminum or aluminum alloy layer;
    patterning said wiring layer; and
    covering said wiring layer with a protective insulating film, wherein all required heat treatment steps performed after said forming and prior to said covering are performed at a temperature lower than 150° C. and lower than a temperature for plastic deformation of said wiring layer, with the temperature for plastic deformation of said wiring layer being lower than a temperature for recrystallization of said wiring layer.

2. A method for fabricating a semiconductor device according to claim 1, wherein a thickness of said wiring layer is 2 μm or more.

3. A method for fabricating a semiconductor device according to claim 1, further comprising:
    etching to perform patterning of said wiring layer; and
    removing a resist used for patterning of said wiring layer.

4. A method for fabricating a semiconductor device according to claim 1, wherein said wiring layer is a top wiring layer.

* * * * *